US006815872B2

(12) United States Patent
Ingram et al.

(10) Patent No.: US 6,815,872 B2
(45) Date of Patent: Nov. 9, 2004

(54) ULTRASONIC TRANSDUCER SYSTEM HAVING AN ORGANIC-STRUCTURAL-MATERIAL HOUSING

(75) Inventors: Douglas Edward Ingram, Cincinnati, OH (US); Richard Eugene Klaassen, West Chester, OH (US); Francis H. Little, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 127 days.

(21) Appl. No.: 10/104,758

(22) Filed: Mar. 21, 2002

(65) Prior Publication Data

US 2003/0178916 A1 Sep. 25, 2003

(51) Int. Cl.$^{7}$ ............................ H02N 2/00; H01L 41/04

(52) U.S. Cl. ....................... 310/328; 310/336; 310/311; 310/337; 310/340; 310/342

(58) Field of Search ................................ 310/328, 336, 310/311, 337, 340, 342, 348, 800

(56) References Cited

U.S. PATENT DOCUMENTS

| | | | | | |
|---|---|---|---|---|---|
| 4,346,505 | A | * | 8/1982 | Lemonon et al. | 29/25.35 |
| 4,446,396 | A | * | 5/1984 | Claus et al. | 310/334 |
| 4,635,484 | A | * | 1/1987 | Lerch | 310/336 |
| 4,877,988 | A | * | 10/1989 | McGinniss et al. | 310/800 |
| 5,444,323 | A | | 8/1995 | Brazil | 310/328 |
| 5,586,085 | A | * | 12/1996 | Lichte | 367/99 |
| 5,735,226 | A | | 4/1998 | McNeal | 114/222 |

* cited by examiner

*Primary Examiner*—Thomas M. Dougherty
*Assistant Examiner*—J. Aguirrechea
(74) *Attorney, Agent, or Firm*—McNees Wallace & Nurick LLC

(57) ABSTRACT

An ultrasonic transducer system has at least one ultrasonic transducer. Each ultrasonic transducer includes a housing having a wall that is made at least in part of an organic structural material that is substantially impervious to water; and an ultrasonic sensor element located at least in part within the housing and positioned to transceive ultrasonic signals. The wall is preferably cylindrical in shape and made of polyvinylchloride plastic. An electrically grounded shield is within the housing and adjacent to an interior wall surface. The ultrasonic sensor element may be a piezoelectric copolymer film ultrasonic sensor element.

18 Claims, 2 Drawing Sheets

ULTRASONIC TRANSDUCER SYSTEM HAVING AN ORGANIC-STRUCTURAL-MATERIAL HOUSING

This invention relates to an ultrasonic transducer and, more particularly, to the housing that protects the ultrasonic sensor element.

BACKGROUND OF THE INVENTION

Ultrasonic techniques are widely used to inspect articles. In this approach, an ultrasonic signal is transmitted toward or into the article. The ultrasonic signal that is passed through or reflected from the article is sensed and compared with the transmitted ultrasonic signal. The results yield information about the internal structure of the article and/or the presence of defects such as cracks in the article.

An ultrasonic transducer used in such inspection procedures includes an ultrasonic sensor element that typically is a transceiver which transmits an ultrasonic signal, receives an ultrasonic signal, or both transmits and receives an ultrasonic signal. The sensor element is enclosed within a housing that mechanically and electrically protects the sensor element. For applications where the ultrasonic transducer is to be immersed in water or other liquid, the housing is usually made of stainless steel. There may be some electronic components located within the housing as well. An electrical cable connects to the housing and thence to the sensor element through a feedthrough, to provide electrical communication between the sensor element and the internal electronics, if any, and external driver and/or analysis electronics.

For some applications, the available ultrasonic transducers are too heavy. They cannot be supported and moved properly by the available support structures. This situation most commonly arises where it is desired to inspect two or more areas on the article at the same time, so that two or more ultrasonic transducers arranged as an ultrasonic transducer system must be supported from the same support structure. In one solution to the problem, the housing has been made of aluminum alloy or titanium alloy to reduce the weight of the housing. It has been found that the aluminum alloys corrode over time, producing a hole in the housing, and that the titanium alloys are too expensive.

There is accordingly a need for an improved ultrasonic transducer that is lighter in weight that those currently available, and is also sufficiently sturdy and corrosion resistant that it does not deteriorate over time. The present invention fulfills this need, and further provides related advantages.

SUMMARY OF THE INVENTION

The present approach provides an ultrasonic transducer system with an ultrasonic transducer having a housing that is light in weight and fully protects the ultrasonic sensor element mechanically in water immersion and electrically against external radio frequency electrical noise. The ultrasonic transducer system may include single or multiple ultrasonic transducers.

An ultrasonic transducer system has at least one ultrasonic transducer. Each ultrasonic transducer includes a housing having a wall that is made at least in part of an organic structural material that is substantially impervious to water. Polyvinylchloride plastic is the preferred material of construction of the housing. Many other common plastics absorb water, resulting in a change in shape that distorts the assembly, and are therefore not acceptable materials of construction for the housing. An ultrasonic sensor element is located at least in part within the housing and positioned to transceive ultrasonic signals. The housing preferably has a lateral side which is substantially cylindrical in shape. The ultrasonic sensor element is preferably a piezoelectric copolymer film ultrasonic sensor element.

The ultrasonic transducer system desirably further includes an electrically grounded shield within the housing and adjacent to an interior wall surface. The grounded shield is desirably made of an electrically conductive metal.

The ultrasonic sensor element is preferably a piezoelectric copolymer film ultrasonic sensor element. Such an ultrasonic sensor element comprises a backing structure located at least in part within the hollow interior of the housing and having a backing surface facing out of the housing through the open first end of the housing, a backing electrode lying against the backing surface, and a ground electrode overlying the backing electrode. The backing surface is preferably concavely curved relative to the backing structure.

The ultrasonic transducer system preferably includes at least two ultrasonic transducers, with each ultrasonic transducer comprising the structure set forth above. There is typically a support structure upon which each ultrasonic transducer is supported.

In one embodiment, an ultrasonic transducer system has at least one ultrasonic transducer. Each ultrasonic transducer comprises a housing having a wall that defines a hollow interior of the housing and includes a cylindrical lateral side, an open first end, and a closed second end. The wall is made of polyvinylchloride plastic. An electrically grounded shield is within the housing and adjacent to an interior wall surface of the lateral side of the housing. The grounded shield is made of an electrically conductive metal. An ultrasonic sensor element is located at least in part within the housing and positioned to transceive ultrasonic signals through the open first end of the housing. Features discussed elsewhere herein may be used with this embodiment.

The ultrasonic transducers of the present approach have substantially reduced weight as compared to conventional transducers, due to the use of the water impervious structural-organic housing. The structural-organic housing is not an electrical conductive material that shields the ultrasonic sensor element from external radio frequency signals. The electrically grounded shield provides this protection against external radio frequency signals. The manufacturing cost of the ultrasonic transducer is also reduced due to the use of the structural-organic material.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
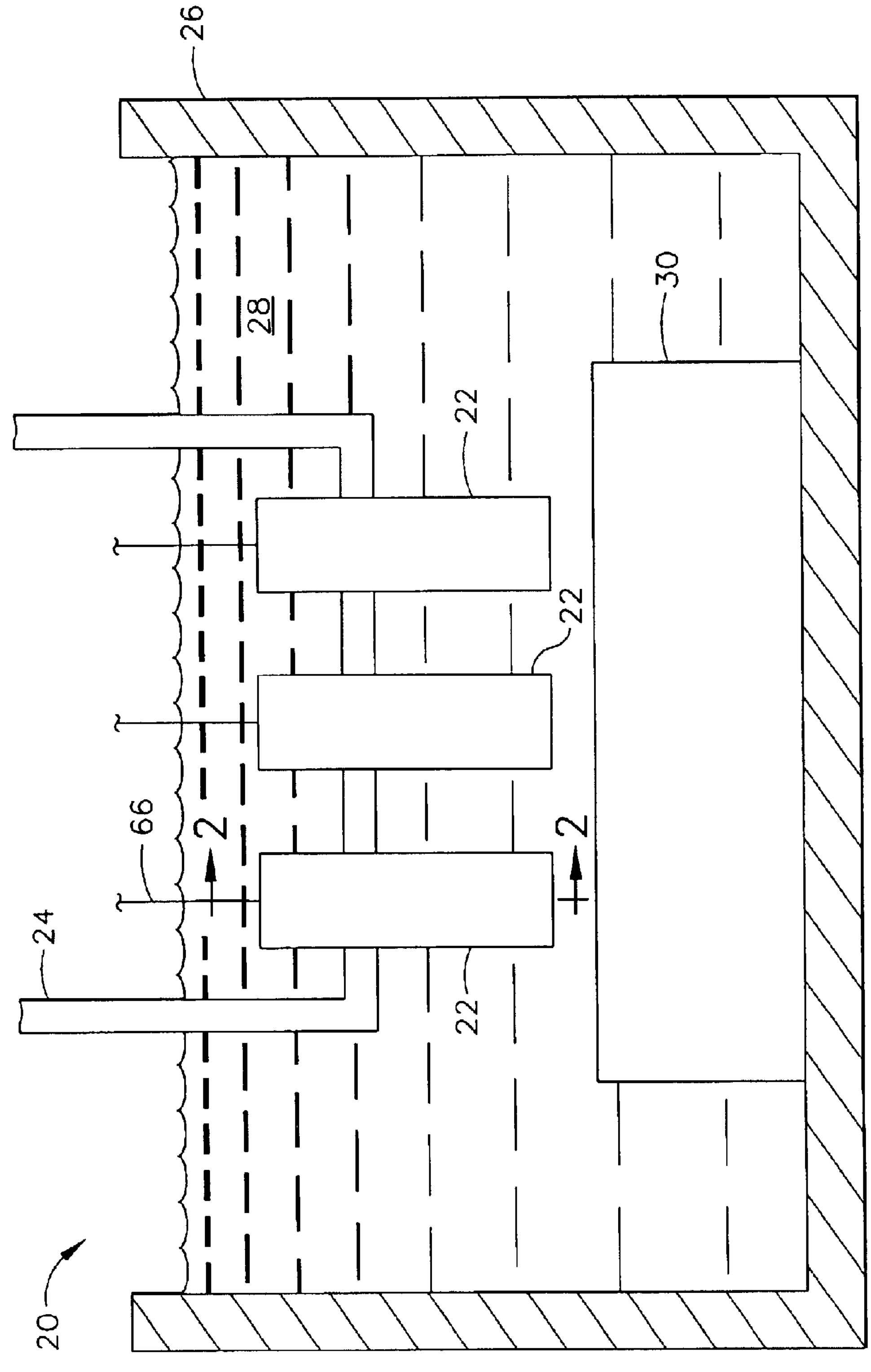
FIG. 1 is a schematic view of an ultrasonic transducer system and its use to inspect an article.

FIG. 1 depicts an ultrasonic transducer system 20 having at least one ultrasonic transducer 22, preferably at least two ultrasonic transducers 22, and in the illustrated case three ultrasonic transducers 22. The three ultrasonic transducers 22 are supported by a support structure 24 in a tank 26 of water 28. The ultrasonic transducers 22 are aimed at a workpiece 30 that is being inspected.

Figure 2:
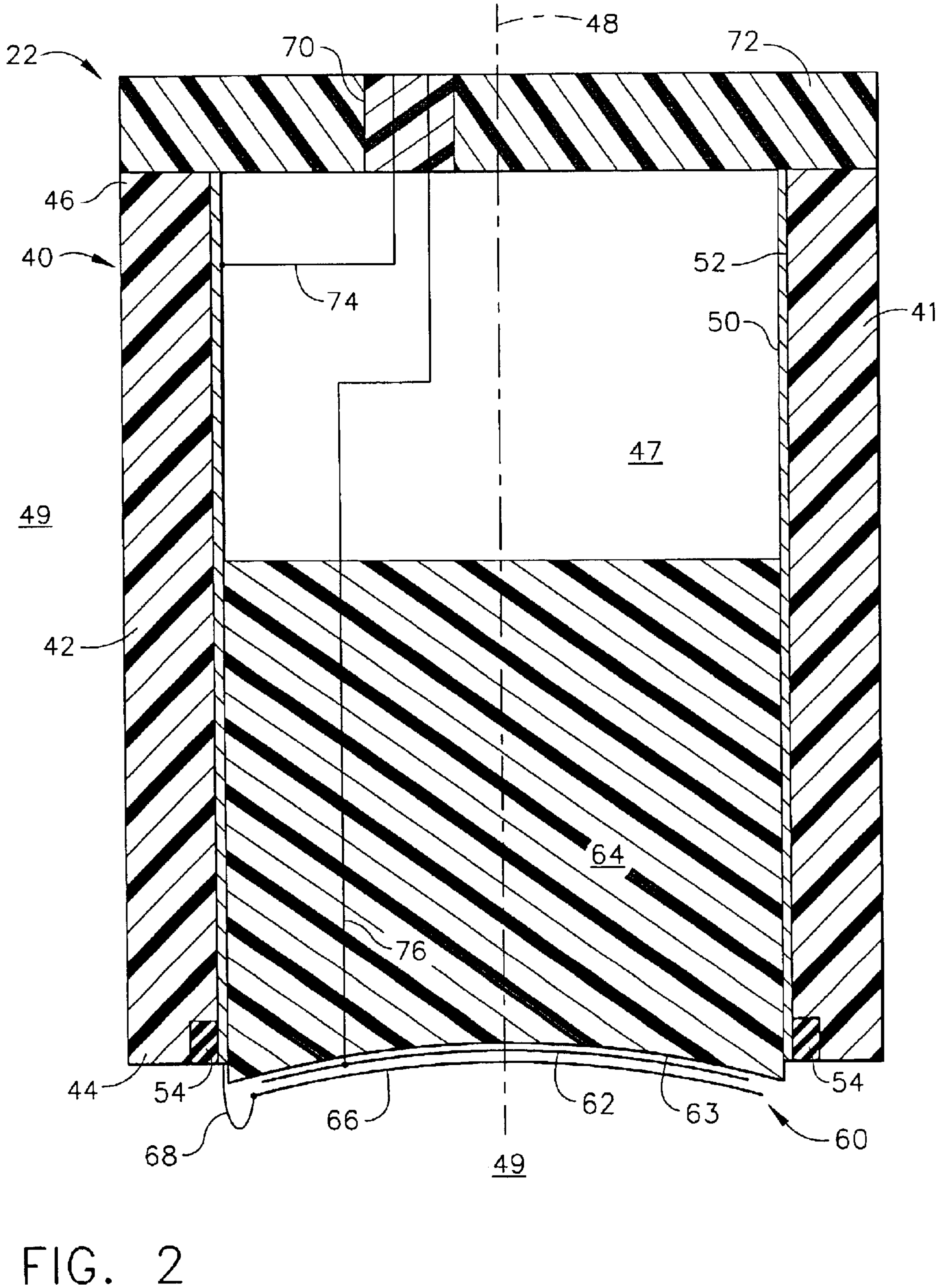
FIG. 2 is a schematic sectional view of a preferred form of one of the ultrasonic transducers of FIG. 1, taken on line 2—2.

The structure of a preferred form of the ultrasonic transducers 22 is shown in greater detail in FIG. 2. Each ultrasonic transducer 22 comprises a housing 40 having walls 41 including a lateral side 42 with a first end 44 and a second end 46. The walls 41 define a hollow interior 47, and there is an exterior 49 relative to the housing 40. The lateral side 42 of the housing 40 is preferably a hollow cylinder in shape with a cylindrical axis 48, so that the lateral side 42 is a cylindrical surface.

The housing 40 is made of an organic structural material that is substantially impervious to water, in a sufficient thickness that the housing 40 is structurally rigid. A preferred organic material used to construct the housing 40 is polyvinylchloride (PVC) plastic, which is "substantially impervious" to water in that it is impervious to water over extended periods of time. Other plastics that are not suitable for use as the material of construction of the housing 40 are those which are not substantially impervious to water. An example of an unacceptable plastic material is Delron™ plastic, which is not impervious to water and gradually absorbs water when it is contacted to water.

An electrically grounded shield 50 is located within the housing 40 and adjacent to an interior wall surface 52 of the wall 41, here the lateral side 42, of the housing 40. The electrically grounded shield 50 is a hollow body with a shape which generally conforms to that of the interior wall surface 52 of the lateral side 42. The electrically grounded shield 50 covers the interior of the lateral side 42 but leaves the lateral side 42 open at the first end. In the illustrated case, the lateral side 42 is a cylinder, and the electrically grounded shield 50 is a hollow mesh or solid-sheet cylinder with a wall thickness preferably about 0.005 inch thick. The electrically grounded shield 50 is made of an electrically conductive metal such as substantially pure copper. Equivalently, the electrically grounded shield 50 may be embedded within the material of the wall 41.

An ultrasonic sensor element 60 is located at least in part within the housing 40 and positioned to transceive ultrasonic signals to or from the exterior 49, in the illustrated case through the open first end 44 of the housing 40. The term "within the housing" means that the ultrasonic sensor element 60 may extend through the open first end 44 of the housing 40, as illustrated, or it may be partially or completely embedded within the material of one of the walls 41 of the housing 40 (typically at its first end 44).

The ultrasonic sensor element 60 is preferably a piezoelectric copolymer film ultrasonic sensor element. In the illustrated embodiment, the ultrasonic sensor element 60 includes a concavely curved backing electrode 62 made of a material such as a thin piece of aluminum. The backing electrode 62 is conformably supported on a backing surface 63 of a backing structure 64. The backing surface 63 faces outwardly from the housing 40 through the open first end 44, toward the exterior 49. The backing surface 62 is preferably concavely curved relative to the backing structure 64. The backing structure 64 is preferably formed of a cylindrical piece of a backing material such as a cured epoxy. A suitable cured epoxy is Astro 3060 epoxy. The backing structure 64 is a solid piece that is slidably received within the opening at the first end 44 of the housing 40. The backing structure 64 is preferably sealed to the lateral side 42 with a watertight seal 54 of a material such as an epoxy, so that the interior 47 is sealed with respect to the exterior 49.

A ground electrode 66, comprising a piezoelectric copolymer film material such as PVDF (polyvinyldene fluoride copolymer) film, overlies the backing electrode 62. The piezoelectric copolymer film is preferably coated with a thin sputtered gold film. The ground electrode 66 is electrically connected by a ground-electrode wire 68 to the electrically grounded shield 50.

A connector 70 supported on a housing closure 72 of the housing 40 extends through the housing 40. The housing closure 72 closes the second end 46 of the housing 40 and is preferably made of the same material as the housing 40. The connector 70 provides a grounding lead 74 that is electrically interconnected within the hollow interior 47 of the housing 40 to the electrically grounded shield 50, and thence by the ground-electrode wire 68 to the ground electrode 66. The connector 70 also provides a backing electrode lead 76 that is electrically interconnected to the backing electrode 62. The drive and sensed signals are transmitted over the backing electrode lead 76 from and to an external transducer drive and external transducer sensor readout (not shown).

More generally, the ultrasonic sensor element 60 may be of any operable type, functioning at any operable ultrasonic frequency. The ultrasonic sensor element 60 may transmit an ultrasonic signal, receive an ultrasonic signal, or both transmit and receive an ultrasonic signal.

This approach provides an ultrasonic transducer system and an ultrasonic transducer that are fully functional in a water-immersion environment, are light in weight so that multiple ultrasonic transducers may be mounted to the support structure, and are fully protected from external radio frequency interference.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An ultrasonic transducer system having at least one ultrasonic transducer, each ultrasonic transducer comprising:

a housing having a wall that is made at least in part of an organic structural material that is substantially impervious to water;

an ultrasonic sensor element located at least in part within the housing and positioned to transceive ultrasonic signals, wherein the ultrasonic sensor element is a piezoelectric copolymer film ultrasonic sensor element; and an electrically grounded shield within the housing and adjacent to an interior wall surface of the housing, the arounded shield being made of an electrically conductive metal.

2. The ultrasonic transducer system of claim 1, wherein the wall of the housing is made of polyvinylchloride plastic.

3. The ultrasonic transducer system of claim 1, wherein the wall includes a lateral side that is substantially cylindrical in shape.

4. The ultrasonic transducer system of claim 1, wherein the ultrasonic transducer system includes at least two ultrasonic transducers, each ultrasonic transducer comprising the structure set forth in claim 1.

5. The ultrasonic transducer system of claim 1, further including a support structure upon which each ultrasonic transducer is supported.

6. The ultrasonic transducer system of claim 1, wherein the electrically grounded shield is adjacent to a lateral side of the housing, and wherein the grounded shield is a hollow body with a shape which generally conforms to that of the interior wall surface but is open at a first end thereof.

7. The ultrasonic transducer system of claim 1, wherein the electrically grounded shield is substantially cylindrical and is adjacent to the interior wall surface of a substantially cylindrical lateral side of the housing, and wherein the electrically grounded shield is a hollow body that is open at a first end thereof.

8. An ultrasonic transducer system having at least one ultrasonic transducer, each ultrasonic transducer comprising:

a housing having a wall that defines a hollow interior of the housing and includes a cylindrical lateral side, an open first end, and a closed second end, the wall being made at least in part of an organic structural material that is substantially impervious to water;

an electrically grounded shield within the housing and adjacent to an interior wall surface of the lateral side of the housing, the grounded shield being made of an electrically conductive metal; and an ultrasonic sensor element located at least in part within the housing and positioned to transceive ultrasonic signals through the open first end of the housing.

9. The ultrasonic transducer system of claim 8, wherein the ultrasonic sensor element is a piezoelectric copolymer film ultrasonic sensor element.

10. The ultrasonic transducer system of claim 8, wherein the ultrasonic sensor element comprises a backing structure located at least in part within the hollow interior of the housing and having a backing surface facing out of the housing through the open first end of the housing, a backing electrode lying against the backing surface, and a ground electrode overlying the backing electrode.

11. The ultrasonic transducer system of claim 10, wherein the backing surface is concavely curved relative to the backing structure.

12. The ultrasonic transducer system of claim 8, wherein the ultrasonic transducer system includes at least two ultrasonic transducers, each ultrasonic transducer comprising the structure set forth in claim 8.

13. The ultrasonic transducer system of claim 8, further including a support structure upon which each ultrasonic transducer is supported.

14. The ultrasonic transducer system of claim 8, wherein the wall of the housing is made of polyvinylchloride plastic.

15. An ultrasonic transducer system having at least one ultrasonic transducer, each ultrasonic transducer comprising:

a housing having a wall that defines a hollow interior of the housing and includes a cylindrical lateral side, an open first end, and a closed second end, the wall being made of polyvinylchloride plastic;

an electrically grounded shield within the housing and adjacent to an interior wall surface of the lateral side of the housing, the grounded shield being made of an electrically conductive metal; and an ultrasonic sensor element located at least in part within the housing and positioned to transceive ultrasonic signals through the open first end of the housing, wherein the ultrasonic sensor element is a piezoelectric copolymer film ultrasonic sensor element.

16. The ultrasonic transducer system of claim 15, wherein the ultrasonic transducer comprises a backing structure located at least in part within the hollow interior of the housing and having a concavely curved backing surface facing out of the housing through the open first end of the housing, a backing electrode lying against the backing surface, and a ground electrode overlying the backing electrode.

17. The ultrasonic transducer system of claim 15, wherein the ultrasonic transducer system includes at least two ultrasonic transducers, each ultrasonic transducer comprising the structure set forth in claim 15.

18. The ultrasonic transducer system of claim 15, further including a support structure upon which each ultrasonic transducer is supported.

* * * * *

UNITED STATES PATENT AND TRADEMARK OFFICE

CERTIFICATE OF CORRECTION

PATENT NO. : 6,815,872 B2
DATED : November 9, 2004
INVENTOR(S) : Ingram et al.

It is certified that error appears in the above-identified patent and that said Letters Patent is hereby corrected as shown below:

Column 4,
Line 55, under the heading "DETAILED DESCRIPTION OF THE INVENTION," "arounded" should read -- grounded --.

Signed and Sealed this

Twenty-second Day of March, 2005

JON W. DUDAS
*Director of the United States Patent and Trademark Office*